United States Patent [19]

Mueller

[11] 4,414,058

[45] Nov. 8, 1983

[54] METHOD FOR PRODUCING DYNAMIC SEMICONDUCTOR MEMORY CELLS WITH RANDOM ACCESS (RAM) BY DOUBLE POLYSILICON GATE TECHNOLOGY

[75] Inventor: Wolfgang Mueller, Putzbrunn, Fed. Rep. of Germany

[73] Assignee: Siemens Aktiengesellschaft, Berlin & Munich, Fed. Rep. of Germany

[21] Appl. No.: 449,145

[22] Filed: Dec. 13, 1982

[30] Foreign Application Priority Data

Feb. 18, 1982 [DE] Fed. Rep. of Germany ....... 3205858

[51] Int. Cl.³ ...................... B44C 1/22; C03C 15/00; C03C 25/06
[52] U.S. Cl. .................................. 156/643; 29/580; 148/187; 156/651; 156/657; 156/659.1; 357/59
[58] Field of Search ................. 148/1.5, 187; 156/643, 156/646, 651, 653, 657, 659.1, 662; 357/23, 24, 49, 53, 54, 59, 71, 91, 41; 29/571, 580, 591, 578; 204/192 E, 192 M; 427/38, 39, 89, 93

[56] References Cited

U.S. PATENT DOCUMENTS

| 4,075,045 | 2/1978 | Rideout | 156/653 X |
| 4,313,256 | 2/1982 | Widmann | 29/579 |
| 4,335,502 | 6/1982 | Richman | 29/571 |

OTHER PUBLICATIONS

C. N. Ahlquist et al., "A 16 384-Bit Dynamic RAM", *IEEE Journal of Solid-State Circuits*, vol. SC-11, Oct. 1976, pp. 570-573.

S. Matsue et al., "A 256K Dynamic RAM", *Conference Volume, ISCCC 1980, Digest of Technical Papers*, Feb. 1980, pp. 232-233.

J. A. Appels et al., "Local Oxidation of Silicon, New Technological Aspects", *Philips Research Reports*, vol. 26, No. 3, Jun. 1971, pp. 157-165.

A. F. Tasch et al., "The Hi-C RAM Cell Concept", *IEEE Transaction On Electron Devices*, vol. ED-25, Jan. 1978, pp. 33-41.

*Primary Examiner*—William A. Powell
*Attorney, Agent, or Firm*—Hill, Van Santen, Steadman & Simpson

[57] ABSTRACT

The invention provides a method of manufacturing dynamic semiconductor memory cells having random access (RAM) in accordance with the double polysilicon gate technology, with which insulation of adjacent, active regions occurs by thick oxide regions, produced according to known LOCOS technology and with which, for increasing cell capacity, a boron and arsenic ion implantation is executed into the memory region with the use of a photoresist mask. In order to increase component density, the oxide thickness in the memory region/thick oxide transistor region is reduced in a multi-stage etching sequence, axially as well as laterally, so that a gain of about 25% in memory surface and a gain of more than 10 volts in blocking bias is achieved. The inventive method is particularly useful in the production of LSI $Si^2$ gate RAM memories.

12 Claims, 4 Drawing Figures

METHOD FOR PRODUCING DYNAMIC SEMICONDUCTOR MEMORY CELLS WITH RANDOM ACCESS (RAM) BY DOUBLE POLYSILICON GATE TECHNOLOGY

BACKGROUND OF THE INVENTION

1. Field of the Invention

The invention relates to semiconductor components and somewhat more particularly to a method of producing dynamic semiconductor memory cells with random access in accordance with double polysilicon gate technology.

2. Prior Art

The double polysilicon gate ($Si^2$-gate) process is regarded as a standard process for attainment of dynamic RAM (random access memory) memories. This process, used for production of a dynamic 16,384 bit memory, having random access is described by C. N. Ahlquist et al. in *IEEE Journal of Solid State Circuits*, Vol. SC-11, (1976) pages 570–573.

As can be derived from S. Matsue et al., *Conference Volume, ISCCC 1980, Digest of Technical Papers* pages 232–233, a 256 K dynamic RAM memory cell has already been produced with currently attainable structure resolution of approximately 1.5 μm photolithography. Insulation between adjacent active regions (transistors, storage capacitors, diffused zones) is attained by thick oxide regions generated by so-called LOCOS technology. The LOCOS process (local oxidation of silicon) is an insulating method used in producing integrated circuits having high component density. Silicon dioxide ($SiO_2$) is utilized as the insulating material between the various active regions. After selective deposition of an oxide layer and a nitride layer, a local oxidation occurs in the nitride-free zones, whereby a strong lateral under oxidation (the so-called bird's beak) and a strong lateral out-diffusion of field implantation occur, which result in a great width dependency of the threshold voltage for narrow transistors. LOCOS processes of this type are disclosed by J. A. Appels et al., *Philips Research Reports*, Vol. 26, No. 3, (1971) pages 157–165. With this insulation technique, minimum structured dimensions cannot be realized for insulation spacing, apparently because of the gradual transitions between thick oxide and thin oxide regions (bird's beak) of approximately 0.5 μm in length. Therefore, the minimum possible insulation spacing for LOCOS insulation is at about twice a bird's beak length above the minimum structural dimension. As a result, in the case of the 256 K-RAM memory cell described by S. Matsue et al., *Conference Volume ISCCC 1980*, referenced earlier, an additional space requirement of approximately 25% of cell area is required. The larger space requirement for the insulation region causes an enlargement of the overall chip surface. A further basic difficulty in the reduction of insulating spacing occurs because of the so-called short channel effect of a thick oxide transistor. Thick oxide transistor losses inhibit capability for insulation spacing smaller than 2.5 μm.

A. F. Tasch et al., *IEEE Journal Of Electron Devices*, Vol. ED-25, (1978) pages 33–41 describes a HiC (high capacity) RAM cell design whereby, in order to increase cell capacity, a flat arsenic ion implantation and a deep boron ion implantation are performed in the memory region. With such a double implantation, cell capacity of a 256 K memory cell is increased by approximately 25%.

SUMMARY OF THE INVENTION

The invention provides an improved process for producing dynamic RAM memory cells with double polysilicon gate technology whereby the following improvements are attained:

a reduction of cell surface requirements;

a simplification of the technological processes; and an improvement in electrical insulation between adjacent cells and, thus, an increase of dielectric strength.

In accordance with the principles of the invention, the method for producing dynamic semiconductor memory cells with random access in accordance with double polysilicon gate technology wherein a first polysilicon level is applied insulated onto a semiconductor body as a storage electrode for memory areas to be generated in the semiconductor body and a second polysilicon level is applied insulated from the first polysilicon level to define word lines, the insulation of adjacent, active areas occurring by thick oxide regions generated according to known LOCOS technology and with which, in order to increase cell capacity, a flat arsenic ion implantation and a deep boron ion implantation are executed into the memory areas with the use of a photoresist mask, is improved by positioning an edge of the photoresist mask used for the arsenic and boron ion implantation in the center of the thick oxide region located between each memory cell and each thick oxide transistor and reducing the thickness of the oxide in the memory region, both axially and laterally at the junction between the thick oxide regions and the thin oxide regions by etching.

In a preferred embodiment of the invention, the following method steps occur sequentially:

(a) producing insulation regions in the form of structured $SiO_2$ layers on a semiconductor body for separating active regions thereon in accordance with the so-called LOCOS or iso-planar method, whereby a boron ion implantation for defining the threshold voltage of the insulation regions is executed immediately before the LOCOS oxidation, after masking the active regions with a silicon nitride mask;

(b) removing the silicon nitride mask and performing a surface-wide oxidation process;

(c) applying a photoresist mask in such a manner that a mask edge is positioned in the center of the insulation region between a memory cell and a thick oxide transistor;

(d) etching the oxide surface in the uncovered thick oxide and thin oxide regions to a thickness of the thin oxide region over the memory region of less than about 30 nm;

(e) generating memory regions by a boron and arsenic ion implantation in such a manner that the boron ion implantation is executed so as to penetrate the uncovered thick oxide regions and increase the boron doping under the thick oxide, while the arsenic ion implantation is executed so as to take effect only in the active memory region;

(f) etching the oxide layer not covered by the photoresist mask to a value which corresponds to approximately ⅔ of the initial thickness of the insulation oxide layer;

(g) removing the photoresist mask and surface-wide etching the oxide layer surface by a further 100 nm; and (h) generating a gate oxide, a first polysilicon level, an insulation oxide and a second polysilicon level, as well as source/drain regions, an intermediate oxide and contacts in a known manner.

In alternative embodiments of the invention, the above process sequence can be modified so that it is possible to execute the entire over-etching step (steps d, f and g) in a single etching process before implantation, with the use of the photoresist mask for the memory ion implantation. The ion implantation is then executed without a scatter oxide whereby the energy of the boron ion implantation can be correspondingly reduced. This occurs by reducing the implantation energy from about 140 keV to about 100 keV.

DESCRIPTION OF PREFERRED EMBODIMENTS

Figure 1:
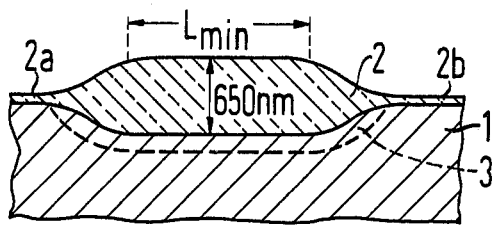
FIGS. 1-4 are enlarged, fragmentary, elevated, cross-sectional schematic views illustrating an exemplary method sequence for practicing the principles of the invention in producing dynamic semiconductor memory cells with random access in accordance with the double polysilicon gate technology.

In the various views, identical reference numerals have been utilized to identify identical parts.

As shown in FIG. 1, a doped semiconductor body 1, preferably p-doped and having a resistivity of about 20 ohm.cm, is provided with thick oxide layers 2 (only one of which is shown) required for separation of active regions. The thick oxide layers 2 can be generated in a traditional manner in accordance with LOCOS technology. A boron-doped region 3 has been introduced in a known manner beneath the thick oxide layers 2 as a channel stop (setting the threshold voltage at approximately 10 volt) whereby boron ions at a dosage of about $2 \cdot 10^{12}$ cm$^{-2}$ and at an energy level of about 120 keV are implanted before the LOCOS oxidation and with the use of appropriately structured nitride masks (not shown) on the active regions. Sometimes hereafter, the boron-doped regions 3 are referred to as boron field implantations or boron channel stops.

FIG. 1 illustrates that part of an arrangement essential to the invention, after removal of the nitride mask (the LOCOS process, because it is well known, is not illustrated in detail) and after oxidation of the semiconductor surfaces. In the exemplary embodiment shown, the thick oxide layers 2 have a layer thickness of 650 nm while the thin oxide regions 2a and 2b each have a layer thickness of 75 nm. The region of a minimum structural dimension, L$_{min}$, is indicated by the double-headed arrow above the sectional view.

Figure 2:
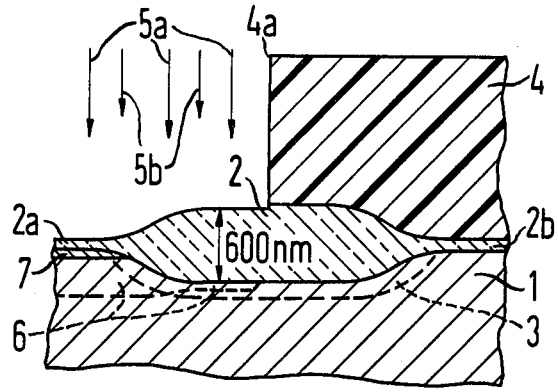

In FIG. 2, memory regions are defined with the assistance of an implantation mask 4 composed of photoresist whereby boron ions (sechematically indicated at 5a) and arsenic ions (schematically indicated at 5b) are implanted into the semiconductor body 1. As shown, a photoresist mask edge 4a is positioned in the center of the oxide insulation region (comprised of regions 2, 2a and 2b). The oxide surface is then partially etched off so that the thickness of the uncovered or free thin oxide region 2a is reduced to a value of less than 30 nm and preferable to a value of about 25 nm, while the thickness of the uncovered or free thick oxide region 2 is reduced to about 600 nm. A so-called HiC implantation (high capacity) now occurs so that a more deeply buried boron implantation 6 is first introduced and then a flat, shallower, arsenic implantation 7 is introduced into the memory region. The implantation parameters for the boron implanted regions 6 are selected in such a manner that both a maximum gain in memory capacity and a sufficiently good dielectric strength in the storage diode are guaranteed and are also selected such that the boron ions are introduced at a sufficient energy (or depth) so that as large of a portion as possible of the boron ion dosage penetrates the uncovered regions of the thick oxide 2 and thereby increases the doping of the channel stop 3. In an exemplary embodiment, the boron implantation dosage is set or adjusted so as to be in the range of about $5 \times 10^{12}$ to $8 \times 10^{12}$ cm$^{-2}$ and preferably is set at about $7 \times 10^{12}$ B cm$^{-2}$ with an energy level of about 140 keV. The implantation parameters for the arsenic implanted region 7 are selected so as to define the threshold voltage in the memory region. Because of its relatively low penetration depth (a dosage of about $5 \times 10^{13}$ to $3 \times 10^{14}$ cm$^{-2}$ and preferably $1 \times 10^{14}$ As cm$^{-2}$, with an energy level of about 100 keV), the arsenic ions cannot penetrate the thick oxide region 2.

Figure 3:
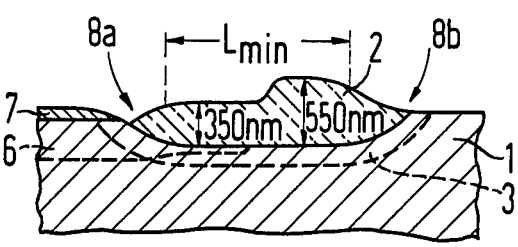

In FIG. 3, a next sequential method step is performed whereby the uncovered regions of the thick oxide and the thin oxide areas (2, 2a) are further etched (in the exemplary embodiment these oxide regions are etched sufficiently for a thickness reduction of about 150 nm) while the bird's beak length (see arrow 8) is reduced to about 0.3 µm. Next, the photoresist mask 4 is removed and a subsequent surface-wide etching of the uncovered oxide surfaces is undertaken so that a thickness reduction of about 100 nm occurs. In this manner, the bird's beak 8a of the memory region is reduced in length to approximately 0.25 µm with a 350 nm field oxide thickness. For a typical 256 K cell design, this corresponds to a gain of 25% in the memory surface. The bird's beak 8b of the remaining active region (which was initially covered by the mask 4) now amounts to about 0.5 µm. The insulating behavior of the thinned field oxide regions 2 is significantly better than that of the unthinned oxide regions (prior art) because of the increased boron doping. As a result of the inventive process, a gain of more than 10 volts is achieved in blocking bias.

Figure 4:
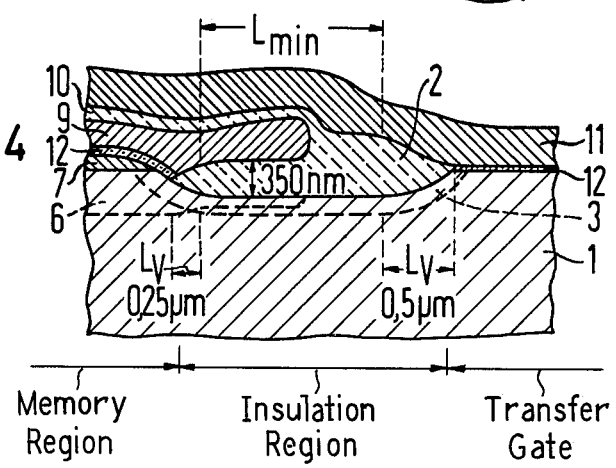

As can be seen from FIG. 4, an improved planarity of components occurs as a further advantage of the inventive process, due to a lowering of the polysilicon-1-thick oxide overlap. The structure illustrated in FIG. 4 is that attained after execution of gate oxidation 12, application and structuring of polysilicon-1-electrode 9, generation of insulating oxide 10, and application/structuring of a polysilicon-2-electrode 11. The minimum structural dimensions, L$_{min}$, as well as the length of the respective bird's beaks, L$_V$ can be visualized from FIG. 4. The active memory region of the cell, the region of a selection transistor or transfer gate and the insulating region are labeled in FIG. 4 by the double-headed and, respective, directional arrows.

Wet-chemical etching techniques, for example with buffered hydrofluoric acid solutions, as well as with reactive dry etching techniques, such as, preferably, the plasma-etching technique, can be utilized as etching techniques for thinning the insulating oxide layers in the practice of the invention.

Alternatively to the process sequence described in conjunction with the exemplary embodiment discussed (FIG. 1 through FIG. 4), the entire over-etching step can be performed before the ion implantation step (5a, 5b of FIG. 2) with the use of the property positioned photoresist mask 4 (for the ion implantation) with a 200 nm erosion of the thick oxide transistors (layers 2). The boron/arsenic ion implantation then occurs in the following steps, without oxide, with the energy level of at least the boron implantation being correspondingly reduced.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not be to construed or interpreted as being restrictive or otherwise limiting of the present invention, excepting as it is set forth and defined in the hereto-attached claims.

We claim as our invention:

1. In a method for manufacturing dynamic semiconductor memory cells with random access in accordance with the double polysilicon gate technology having a first polysilicon level (9) applied insulated onto a semiconductor body (1) as a memory electrode for the memory regions generated in said semiconductor body and having a second polysilicon level (11) applied insulated from said first polysilicon level (9) as word lines, with which the insulation of adjacent, active regions occurs by thick oxide regions (2) generated according to known LOCOS technology and with which, for increasing cell capacity, a flat arsenic implantation region (7) and a deep boron implantation region (6) are generated in the memory region with the use of a photoresist mask (4), the improvement comprising:

positioning a photoresist mask edge (4a) in the center of the thick oxide regions (2) located between memory cells and thick oxide transistors; and reducing the thickness of the oxide in the memory regions, both axially and laterally, at the junctions between thick oxide regions (2) and thin oxide regions (2a) by etching.

2. A method for manufacturing dynamic semiconductor memory cells with random access in accordance with double polysilicon gate technology, comprising, in combination, a sequence of the following steps:

(a) producing insulating regions in the form of structured $SiO_2$ layers (2) on a semiconductor body (1) for separation of active regions according to the LOCOS or iso-planar technique, whereby a surface-wide boron ion implantation (3) for setting the threshold voltage of the insulation regions is executed immediately before the LOCOS oxidation and after masking the active regions with a silicon nitride mask;

(b) removing the silicon nitride mask and performing a surface-wide oxidation process;

(c) applying a photoresist mask (4) in such a manner that a mask edge (4a) is located in the center of each insulating region (2) between a memory cell and a thick oxide transistor:

(d) etching the oxide surface of the uncovered thick oxide (2) and thin oxide (2a) regions to a thickness value for the thin oxide region (2a) in the memory region of less than about 30 nm;

(e) generating memory regions by a boron ion implantation (5a) and an arsenic ion implantation (5b) in such a manner that the boron ion implantation is executed so as to penetrate the uncovered thick oxide regions and increase the boron doping under said thick oxide regions while the arsenic ion implantation is executed so as to take effect only in the active memory regions;

(f) etching the oxide layer regions (2, 2a) not covered by said photoresist mask (4) to a value corresponding to approximately ⅔ of the initial layer thickness of the insulating oxide (2);

(g) removing said photoresist mask (4) and performing a surface-wide etching of the oxide layer surface (2, 2a, 2b) by a further 100 nm; and (h) generating a gate oxide (12), a first polysilicon level (9), an insulating oxide (10) and a second polysilicon level (11) as well as source/drain regions, an intermediate oxide and contacts in a known manner.

3. A method as defined in claim 2 wherein steps d, f and g occur before step e, however without removal of the photoresist mask (4).

4. An method as defined in claim 3 wherein the thickness of the uncovered oxide surface (2, 2a) is reduced by about 200 nm by re-etching.

5. A method as defined in claim 2 wherein the thickness of the thick oxide regions (2) before application of the photoresist mask (4) is adjusted to about 650 nm and the thickness of at least one thin oxide region (2a) is adjusted to about 75 nm.

6. A method as defined in claim 2 wherein the thickness of the thin oxide region (2a) attained in step d is about 25 nm.

7. A method as defined in claim 2 wherein the thickness of the thick oxide regions attained respectively in steps f and g is about 350 nm in the region of the memory cell and is about 550 nm in the region of the thick oxide transistor.

8. A method as defined in claim 2 wherein, for generating threshold voltages of the insulation region, the implantation dosage is set to about $2 \times 10^{12} B \, cm^{-2}$ at an energy level of about 120 keV.

9. A method as defined in claim 2 wherein, for generating the memory regions, the boron ion implantation (5a) dosage at step e is set in the range of about $5 \times 10^{12}$ through $8 \times 10^{12} \, cm^{-2}$ with an energy level of about 140 keV and the arsenic ion implantation (5b) dosage at step e is set in the range of about $5 \times 10^{13}$ through $3 \times 10^{14} \, cm^{-2}$ with an energy level of about 100 keV.

10. A method as defined in claim 2 wherein the etching processes in steps d, f and g are executed in a wet-chemical manner by use of buffered hydrofluoric acid solutions.

11. A method as defined in claim 2 wherein the etching processes in steps d, f and g are executed by a reactive dry etching.

12. A method as defined in claim 11 wherein said reactive dry etching comprises plasma etching.

* * * * *